(12) United States Patent
Valeton et al.

(10) Patent No.: US 10,435,578 B2
(45) Date of Patent: Oct. 8, 2019

(54) PRINTING INK COMPOSITION COMPRISING A METAL COMPLEX WITH ADJUSTED VISCOSITY

(71) Applicant: SPGPrints B.V., Boxmeer (NL)

(72) Inventors: Josué Jean Philippe Valeton, Urecht (NL); Robert-Jan Abbel, Eindhoven (NL)

(73) Assignee: SPGPrints B.V., Boxmeer (NL)

( * ) Notice: Subject to any disclaimer, the term of this patent is extended or adjusted under 35 U.S.C. 154(b) by 126 days.

(21) Appl. No.: 14/890,667

(22) PCT Filed: May 6, 2014

(86) PCT No.: PCT/EP2014/059254
§ 371 (c)(1),
(2) Date: Nov. 12, 2015

(87) PCT Pub. No.: WO2014/184060
PCT Pub. Date: Nov. 20, 2014

(65) Prior Publication Data
US 2016/0090499 A1 Mar. 31, 2016

(30) Foreign Application Priority Data
May 17, 2013 (EP) .................................... 13168321

(51) Int. Cl.
*C09D 11/52* (2014.01)
*C08K 5/098* (2006.01)
(Continued)

(52) U.S. Cl.
CPC .............. *C09D 11/52* (2013.01); *C08K 5/098* (2013.01); *C09D 11/03* (2013.01); *C09D 11/38* (2013.01);
(Continued)

(58) Field of Classification Search
CPC ....... C09D 11/525; C09D 11/03; C09D 11/38; C08K 5/098; H01L 21/288;
(Continued)

(56) References Cited

U.S. PATENT DOCUMENTS

2007/0096064 A1 5/2007 Kodas et al.
2009/0000509 A1* 1/2009 Potrawa ............... C08K 5/0041
106/31.13
(Continued)

FOREIGN PATENT DOCUMENTS

CN 101523508 A 9/2009
CN 102395439 A2 3/2012
(Continued)

OTHER PUBLICATIONS

Kamyshny, et al., Meta-Based Inkjet Inks for Printed Electronics, The Open Applied Physics Journal, 2011, vol. 4, pp. 19-36.
(Continued)

*Primary Examiner* — Harold Y Pyon
*Assistant Examiner* — Danny N Kang
(74) *Attorney, Agent, or Firm* — Hoffmann & Baron, LLP

(57) ABSTRACT

A printing ink composition includes a metal salt of a metal ion and a counter ion, and a viscosity adjusting agent. The metal ion is present as a metal complex of the metal ion and the viscosity adjusting agent, the viscosity adjusting agent includes at least one functional ligand, where the functional ligand may be a monofunctional ligand having one functional group and multifunctional ligands having more than one functional groups.

14 Claims, 2 Drawing Sheets

(51) Int. Cl.
*H01L 51/00* (2006.01)
*C09D 11/03* (2014.01)
*C09D 11/38* (2014.01)
*H01L 21/288* (2006.01)
*H05K 3/12* (2006.01)
*H01L 51/42* (2006.01)
*H01L 51/50* (2006.01)

(52) U.S. Cl.
CPC ........ *H01L 21/288* (2013.01); *H01L 51/0004* (2013.01); *H01L 51/0091* (2013.01); *H05K 3/1241* (2013.01); *H01L 51/42* (2013.01); *H01L 51/5012* (2013.01); *H05K 2203/121* (2013.01)

(58) Field of Classification Search
CPC . H01L 51/0004; H01L 51/0091; H01L 51/42; H01L 51/5012; H05K 3/1241; H05K 2203/121
USPC ........................................................ 252/500
See application file for complete search history.

(56) References Cited

U.S. PATENT DOCUMENTS

| | | | | |
|---|---|---|---|---|
| 2010/0021704 | A1* | 1/2010 | Yoon | H01B 1/22 428/209 |
| 2010/0247798 | A1* | 9/2010 | Chung | C09D 5/24 427/535 |
| 2012/0043510 | A1* | 2/2012 | Kurihara | B22F 1/0022 252/514 |
| 2012/0256142 | A1* | 10/2012 | Kostler | C09D 7/1266 252/519.21 |

FOREIGN PATENT DOCUMENTS

| | | | |
|---|---|---|---|
| CN | 102863845 A | 1/2013 | |
| DE | 102008030900 A1 * | 12/2009 | .............. C07F 1/005 |
| EP | 2420336 A1 | 2/2012 | |
| EP | 2803430 A1 | 11/2014 | |
| JP | S64-73802 A | 3/1989 | |
| JP | H11-315241 A | 11/1999 | |
| KR | 10-2007-0058816 A | 6/2007 | |
| WO | 2006/093398 A1 | 9/2006 | |
| WO | 2008/038976 A1 | 4/2008 | |
| WO | 2008/151094 A1 | 12/2008 | |
| WO | 2014/051083 A1 | 4/2013 | |

OTHER PUBLICATIONS

"Preparation and Characterization of Silver based Particle-free Conductive Ink and its Film Formation Investigation", Xiaolei Nie, Chinese Master's Theses Full-text atabase (publication date: May 15, 2013) (pp. abstract, 2, 13, 27, 5, and 57).

Chinese Office Action for corresponding Chinese Application No. 201480028658.1, dated Aug. 29, 2017.

* cited by examiner

PRINTING INK COMPOSITION COMPRISING A METAL COMPLEX WITH ADJUSTED VISCOSITY

CROSS-REFERENCE TO RELATED APPLICATIONS

This application is the National Stage of International Application No. PCT/EP2014/059254 filed May 6, 2014, which claims the benefit of European Application No. EP 13168321.1, filed May 17, 2013, the contents of which is incorporated by reference herein.

FIELD OF THE INVENTION

The invention relates to a printing ink composition, the use of the printing ink composition, to a process of adjusting the viscosity of a metal complex and to a metal complex having an adjusted viscosity.

BACKGROUND OF THE INVENTION

Conductive patterns and tracks are used in a wide variety of electronic devices, e.g. as circuitry. Such conductive tracks are produced by depositing conductive metal complexes on a wide variety of substrates or carrier mediums. First, a precursor metal complex is applied to the substrate. By a curing or reducing step the metal complexes are converted into pure, conductive metal. The patterns can be easily applied by printing methods, e.g. ink-jet printing. The metal complexes which are employed as inks need to have a certain viscosity to be printable.

Metal complexes for printing conductive patterns are known.

US2007/0096064 claims a process for forming conductive features for solar cells. The precursor composition which is applied to obtain said features has a low viscosity of not greater than about 1000 Cps and can also have a low conversion temperature. The low viscosity precursor composition can comprise organic ligands bound to metal salts.

US2010/0021704 describes an organic silver complex in which an organic ligand containing an amine group and a hydroxyl group is bonded with aliphatic silver carboxylate at an equivalent ratio of 2:1 to form a complex. The complex occurs in form of a paste.

US2011/0023658 refers to a method for producing silver nano cubes from a solution comprising at least one polyol, at least one silver compound and at least one organic protective agent. The silver compound is a silver salt while the organic protective agent is a compound which does not react with the polyol. The polyol has at least two hydroxyl groups and is able to reduce the silver compound to silver at elevated temperatures. The product of the reaction of the compounds are solutions which comprise silver nano cubes. These cubes are not employed for printing but are instead used in nano-scale ferromagnetic applications. This document does not reveal how the viscosity of metal complex solutions can be adjusted.

JPH11315241 discloses an inkjet ink composition comprising a liquid containing an organometallic complex metal component and a resin. For the purpose of adjusting the viscosity, the ink is used in the form of an aqueous solution containing a water-soluble resin, such polyvinyl alcohol, polyethylene oxide and methylcellulose.

JPS6473082 discloses a plating paint containing metal ions, a reducing agent for the metal ions, a solvent of the metal ions and a viscosity imparting agent, the latter being exemplified by polyethylene glycol, casein and glue. The viscosity of the plating paint is set at about 0.3-0.4 Pas.

KR20070058816 discloses a silver organo-sol ink comprising as an organic solvent a reactive organic solvent which is said to form a chelating agent or a complex with silver, and a polar or non-polar dilution solvent for controlling viscosity.

CN102863845 discloses a silver-organic conductive ink comprising a saturated carboxylic acid silver compound, an amido compound, a solvent and a thickening agent. The thickening agent is used for adjusting viscosity.

CN101523508 discloses an organic silver complex compound in which an organic ligand containing an amine group and a hydroxyl group is bonded to aliphatic silver carboxylate at an equivalent ratios of 2:1 to form a complex.

None of the prior art documents teaches how the viscosity of such metal complexes can be adjusted and fine-tuned in general and how a printing ink comprising a metal complex with a specifically desired viscosity can be achieved.

SUMMARY OF THE INVENTION

It is therefore an object of present invention to provide a printing ink composition based on a metal complex, in particular allowing setting the viscosity in view of the printing technique to be used. Yet another object is to provide a method of adjusting the viscosity of a metal complex, and to provide a metal complex with stable viscosity. Furthermore, one embodiment of the present invention is directed to a metal complex with a broadened absorption spectrum.

Conductive patterns and tracks produced from the printing ink composition comprising a metal complex according to present invention can exhibit high conductivity and can be printed with high precision.

According to a first aspect of the invention a printing ink composition is provided, which comprises a metal salt of a metal ion and a counter ion, and a viscosity adjusting agent, wherein the metal ion is present as a metal complex of the metal ion and of the viscosity adjusting agent, wherein the viscosity adjusting agent comprises at least one functional ligand, wherein the functional ligand is selected from the group consisting of monofunctional ligands a monofunctional ligand being a ligand having one functional group, and multifunctional ligands a multifunctional ligand being a ligand having more than one functional groups.

According to a second aspect a method of adjusting the viscosity of a metal complex comprising a metal ion and a functional ligand or a combination of functional ligands is provided, wherein the combination of functional ligands comprises one ligand with one functional group, the monofunctional ligand, and at least one ligand with more than one functional group, the multifunctional ligand, that the functional ligand is selected from a monofunctional or multifunctional ligand, and that the viscosity of the metal complex is adjusted by mixing the metal ion and the functional ligand or combination of functional ligands at a ratio.

According to a third aspect of the invention a metal complex is provided, wherein the metal complex comprises a metal ion and a functional ligand or a combination of functional ligands, wherein the combination of functional ligands comprises one ligand with one functional group, the monofunctional ligand, and at least one ligand with more than one functional group, the multifunctional ligand, that the functional ligand is selected from the monofunctional or multifunctional ligand, and that the metal ion and the functional ligand or combination of functional ligands are present at a ratio.

Yet another aspect relates to the use of the metal complex according to the invention as a printing medium, in particular as an ink for printing conductive patterns, semiconductive patterns, emitting patterns and absorbing patterns.

DETAILED DESCRIPTION OF THE INVENTION

Figure 1:
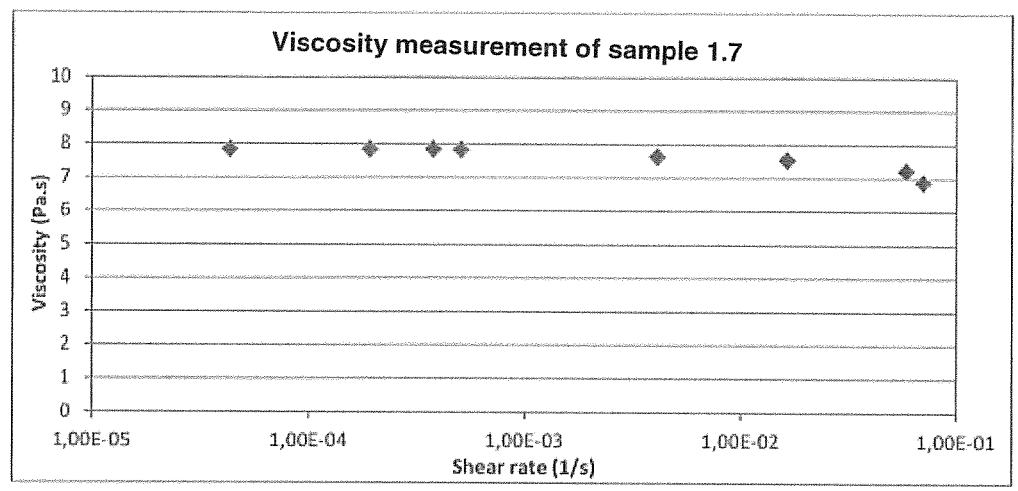
FIG. 1 shows the results of the viscosity measurements using sample 1.7 of Example 1.

The explanation, examples and advantageous and preferred embodiments that are presented hereinbelow, are applicable to all the aspects of the invention.

For the purpose of this application a "functional ligand" is an organic compound comprising at least one functional group. A functional ligand can be a monofunctional ligand or a multifunctional ligand. A monofunctional ligand comprises one functional group and a multifunctional ligand comprises at least two functional groups.

"Functional group" describes a moiety of a ligand compound that is capable of interacting with the metal ion. The functional group can interact via covalent, dative or coordinate bonding. E.g. the ligand has a free electron pair and could be defined as a Lewis base which donates electrons. The metal salt in that case is a Lewis acid and accepts the electrons of the ligand to form an acid-base adduct. The functional group can also form an ionic bond with the metal ion.

Examples of functional groups are hydroxyl-, carbonyl-, amino-, aromatic, ether, ester and thioester groups, unsaturated carbon bonds, and functional radicals. The functional ligand advantageously comprises an amine moiety, pyridine moiety, carboxyl moiety, sulphide, phosphine, (cyclo)(octa)diene or phenanthroline moiety.

Examples of functional ligands are alkynes, amines (ammonia, ethylamine, propylamine), amides, alcohols, aminoalcohols, aldehydes, carboxylic acids, carbamic acids, dienes, phosphines, phosphites, thioamides, more specifically azoles and thioacids. These include multifunctional ligands where the ligand comprises an additional functional group, e.g. diamines. Preferred functional ligands are amines.

In one embodiment the functional groups of the mono- and the multifunctional ligand comprised in the metal complex are the same, in another embodiment the functional groups are different.

In one embodiment the functional ligands within the multifunctional ligand are the same. In another embodiment the functional ligands within one multifunctional ligand are different.

The metal ion is derived from a metal salt, i.e. a compound of the metal ion and a respective counterion. This salt can be an organic or inorganic metal salt. Non-limiting examples of organic metal salts are metal carboxylate, metal carbamate, metal 3-diketonate, metal p-ketoiminate, metal thioamide or metal thioacid. Advantageously the metal salt is selected from a metal carboxylate, a metal carbamate and a metal carbonate, preferably a metal carboxylate, more preferably a metal pivalate.

Advantageously the metal of the metal ion is chosen from Ag, Cu, Pd, Au, Pt, Ni, In, Sn, Al and Zn, preferably the metal is Ag or Cu. Preferred organic metal salts are silver carboxylates, silver carbamates, copper carboxylates and copper carbamates. Preferably, silver carboxylate, more specifically a silver pivalate is used as metal salt.

Non-limiting examples of inorganic salts are metal nitrate, metal sulfate and metal chloride.

The ink composition according to the invention comprises a viscosity adjusting agent, that complexes the metal ion of the metal salt. Thus in the ink composition the metal ion is present as a metal complex of the metal ion and of the viscosity adjusting agent. The viscosity adjusting agent comprises at least one functional ligand, which is selected from the group consisting of monofunctional ligands wherein a monofunctional ligand is a ligand having one functional group, and multifunctional ligands wherein a multifunctional ligand is a ligand having more than one functional groups.

To adjust the viscosity of the metal complex according to this invention, e.g. in preparing the ink composition according to the invention, the metal ion and the functional ligand or combination of functional ligands are mixed at a certain ratio. The ratio of metal ion to the functional ligand(s) is a molar ratio 1:y, where y represents the total molar amount of functional groups present in the functional ligand(s), and wherein y is between 1 and 4, preferably between 1 and 3, more preferably between 1 and 2 and even more preferably between 1 and 1.5. For example 1 M of metal ion is mixed with 1 M equivalent of functional groups. In one embodiment the molar ratio between the metal ion and the functional groups of the ligand(s) is between 1 and 1.3, preferably between 1.2 and 1.25. Within these ratio ranges it is possible to obtain a liquid metal complex.

The chosen ratio depends on the size or bulkiness of the metal ion, the counter ion with which it forms the metal salt and the size of the functional ligand. A ligand with a large, bulky structure will require a lower ratio, that means less of the ligand is to be added to the metal ion. A small counter ion, as e.g. a formate will increase the amount of functional ligand or combination of ligands to be added.

If a monofunctional ligand and a multifunctional ligand are added to the metal salt, also the ratio between the monofunctional and multifunctional ligand influences the viscosity of the metal complex. With increasing amounts of multifunctional ligand the viscosity of the metal complex increases. A higher percentage of functional groups supplied by a multifunctional ligand correlates logarithmically with an increase in the viscosity of the metal complex. By choosing a combination of metal salt (metal ion and counter ion) and ligand or ligands it is possible to adjust the viscosity to a desired value.

In one embodiment the metal complex comprises at least one monofunctional and at least one multifunctional ligand. Therefore, the metal complex can comprise either at least one monofunctional ligand, or at least one multifunctional ligand, or at least one monofunctional ligand and at least one multifunctional ligand. A combination of one monofucntional ligand and one multifunctional ligand is preferred.

If a monofunctional ligand is used this means for example that 1 M of metal salt and between 1.1 and 1.4 M of the monofunctional ligand is used to arrive at a 1:y ratio of 1:1.1-1.4. Such a metal is e.g. silver complexed with monoamine ligands.

If e.g. a multifunctional ligand with two functional groups is used, 1 M of the same metal salt would be mixed with 0.55-0.7 M of said bifunctional ligand to obtain a complex with the same ratio of metal ion to functional groups.

In case that e.g. a copper (tetrahedral) is complexed, 1 M of the copper salt would be mixed with 1-2 M of a monofunctional ligand or with 0.5-1 M of a bifunctional ligand. A possible embodiment of such a copper salt is copper(II) 2-ethylhexanoate.

If a combination of monofunctional and multifunctional ligand are used the total number of functional groups of the monofunctional and the multifunctional ligand is used to arrive at the same molar ratio metal ion:functional group, as in the case where only one type of ligand is used.

For example, 1 M of the metal salt can be combined with e.g. 1.125 M of a monofunctional ligand and 0.0625 M of a bifunctional ligand to arrive at a ratio of 1 M metal ion to 1.25 M of functional groups. In this example 90% of the functional groups in the metal complex are supplied by the monofunctional ligand and 10% by the bifunctional ligand.

The relative amount of monofunctional and bifunctional ligand among each other can also be varied such that e.g. 1 M of the metal salt is mixed with 0.75 M of the monofunctional ligand and 0.25 M of the bifunctional ligand to arrive at the same metal ion to functional group ratio of 1:1.25. In this example 60% of the functional groups are supplied by the monofunctional ligand and 40% by the bifunctional ligand. The metal complex comprises the metal ion and functional groups at the same molar ratio but the viscosity is changed if more functional groups originate from the multifunctional ligand.

If a monofunctional and a trifunctional ligand would be combined with the same metal salt, the following mixture could be prepared: 1 M metal salt, 0.75 M of monofunctional ligand and 0.167 M of trifunctional ligand. Again the molar ratio metal salt:functional groups is 1:1.25. In this example 60% of the functional groups are supplied by the monofunctional ligand (and 40% by the trifunctional ligand).

The percentage of functional groups derived from the monofunctional ligand can vary between 1-99%, and the percentage of functional groups derived the one or more multifunctional ligands can vary between 99-1% in the embodiment where a monofunctional and multifunctional ligand are combined in the metal complex. For example, 5, 10, 20, 30, 40 or 50% of the functional groups can be supplied by at least one multifunctional ligand. This is chosen based on the desired viscosity, the metal salt and the functional ligands.

For liquid metal salts it is especially advantageous to only add multifunctional ligand to increase the viscosity of the metal complex. Non-limiting examples of such liquid metal salts are zinc(II) neodecanoate and tin(II) 2-ethylhexanoate. The final ratio metal salt to functional groups in such case is preferably between 1:1.1-1.4.

For non-liquid metal salts it is preferred to add monofunctional and multifunctional ligands to obtain a complex with the desired viscosity. Non-limiting examples of non-liquid metal salts are silver 2-ethylhexanoate, silver neodecanoate, silver acetate, silver pivalate, copper(II) 2-ethylhexanoate, copper(II) formate, copper(I) acetate and copper (II) acetate.

In general, addition of a monofunctional ligand leads to a decrease in viscosity while addition of a multifunctional ligand results in an increase of viscosity.

The viscosity of the metal complex can be adjusted between 0.5 and 50 Pa·s. In one embodiment the viscosity of the metal complex according to this invention can be tuned between 1 and 20 Pa·s, preferably between 1 and 10 Pa·s. The specific range of the adjustable viscosity depends on the metal salt and on the ligands which are used in the metal complex according to this invention. For example in the case of silver neodecanoate with diisopropylamine as monofunctional ligand and N,N'-diethylethylenediamine as bifunctional ligand, the viscosity can be tuned between 0.7 Pa·s and at least 10 Pa·s.

Generally for use in inkjet printing the printing ink composition according to the invention has a viscosity of 3-25 mPa s; for flexo printing 0.05-0.5 Pa s; and for screen printing 1-10 Pa s. Screen printing is a preferred technique.

In the context of this invention the viscosity refers to the shear viscosity, which expresses the resistance of a fluid to shearing forces. It is determined by using a rheometer (e.g. TA Instruments AR-G2).

Surprisingly, it was found that not only it is possible to narrowly adjust the viscosity of the metal complex but it was also found that the viscosity of the metal complexes is very stable. Stability of viscosity means that the viscosity is largely unchanged (within a margin of 1-5% of change of the viscosity value) when measured at one point of time and measured again after exposing the metal complexes for a certain period of time to atmospheric conditions. Atmospheric conditions are conditions in which a container comprising the metal complex is left open at room temperature (20° C.) and atmospheric pressure.

Advantageously the viscosity of the metal complex remains unchanged for at least 24 hours under atmospheric conditions, preferably for at least 48 hours, more preferably for at least 72 hours and even more preferably for at least 96 hours.

When the metal complex is stored in a closed container, advantageously the viscosity remains stable for at least 15 days, preferably for at least 25 days and more preferably for at least 35 days. This means that the metal complexes of the invention have a long shelf life. In consequence, the metal complexes according to this invention can be prepared and stored before printing. The stable viscosity of the metal complexes is an advantageous feature because it simplifies the use and storage of inks which comprise the metal complexes of present invention.

The metal complexes of present invention are advantageously used as ink for producing conductive tracks and patterns, semiconductive tracks and patterns and emitting and absorbing tracks and patterns. Emitting patterns are e.g. used in OLED (organic light-emitting diode) products. Absorbing patterns absorb electromagnetic radiation and are e.g. used in photovoltaic products. Conductive tracks have at least a conductivity of 1000 Siemens per centimeter (S/cm). Semi-conductive tracks have a conductivity of $10^{-8}$ to $10^3$ S/cm.

Suitable substrates to be printed with the ink composition are plastic substrates, ceramic substrates and glass substrates or any hybrid combination of these materials. The substrates can be in various forms, e.g. foils. Optionally, the substrates can be coated by a functional layer, such as, but not limited to silicon nitride, indium tin oxide, zinc oxide and poly(3,4-ethylenedioxythiophene).

In one embodiment several metal complexes according to the invention are combined to obtain one ink. It is also possible, that one metal complex serves as ink. Furthermore, the ink comprising at least one metal complex according to this invention can also include other ink additives well-known to the skilled person in the art, as e.g. adhesion promoters or binders.

The present invention also provides a method of obtaining a conductive track or pattern. The method comprises the following steps: i) deposition of the ink composition comprising the metal complex on a substrate, and ii) converting the deposit into a metal film.

The first step can be carried out by any known method of (solution-based) deposition, e.g. printing, solution casting, spin coating, doctor blading, dip coating, capillary filling or spray coating. Possible printing methods are contact printing and non-contact printing, such as ink-jet printing, screen printing, off-set printing and flexo printing. Preferred are forms of non-contact printing because they do not damage the substrate.

The conversion occurring during the second method step can be caused by electromagnetic radiation, heat convection, plasma treatment, or chemical reduction, or any combination of these. Preferably, the conversion is caused by electromagnetic radiation or heat convection, or a combination of these two.

In one embodiment the present invention also pertains to a metal complex comprising a colourless or nearly colourless metal salt and a combination of at least one monofunctional ligand and/or at least one multifunctional ligand.

Surprisingly, it was found that such metal complexes which comprise multifunctional ligands have a broadened radiation absorption spectrum compared to metal salts and metal complexes comprising only monofunctional ligands. The addition of monofunctional ligand alone changes the absorption wavelength of the metal complex a little. When also a multifunctional ligand is added to the metal salt complex the metal complex can absorb radiation of larger wavelength or broader range, thereby e.g. enabling selective absorption at a specific wavelength. The metal complex can e.g. also absorb radiation with a wavelength of 450-550 nm while for a metal salt complex only comprising a monofunctional ligand absorption is limited to wavelengths of up to 300 nm. The advantage of this is that such a metal complex can be exposed to a wavelength of a radiation which will be absorbed by the metal complex but not by the substrate to which the metal complex was applied. The absorption spectrum of the substrate (e.g. PET foil) differs from the metal complex. This effect can be employed to use a specific (non-ionic) radiation source with a narrow wavelength spectrum such that the metal complex absorbs the radiation and is heated but the foil does not absorb the radiation and is therefore not heated. In consequence, the metal complex is efficiently cured but the substrate is not heated. This is especially advantageous if heat sensitive substrates as e.g. thermoplastic foils are used as substrate. The broadening of the radiation absorption pattern has the largest effect in colourless metal salts. In a preferred embodiment, silver salts in combination with a monofunctional and a bifunctional ligand are used to form a metal complex with a broadened absorption pattern. Suitable lamps to emit radiation with a narrow spectrum are for example LED lamps.

Therefore, the viscosity and also the light absorption spectrum of metal complexes of present invention can be adjusted by adjusting the amount of mono- and multifunctional ligands.

In a preferred embodiment the inks of present invention are solvent-free, i.e. they are prepared without the use of any additional solvents. In this case the inks are comprised of a metal complex which contains a metal ion and functional ligand or a combination of functional ligands. The metal complex is liquid and the viscosity is adjusted by varying the ratio of metal ion to functional group and optionally the ratio between mono- and multifunctional ligand.

Mixing of metal salts and ligand or ligands can be carried out by adding them together and mixing with a mechanical stirrer. In one embodiment the monofunctional ligand and the metal salt comprising the metal ion are added and mixed first, while only later the multifunctional ligand is added.

EXAMPLES

1. Adjusting the Viscosity of a Metal Complex

Metal complexes according to the invention were prepared by mixing a metal salt and functional ligands. Either only a monofunctional ligand or a monofunctional and a multifunctional ligand were mixed. Varying amounts of diisopropylamine (DiPA, a monofunctional ligand) was added to varying amounts of silver neodecanoate (SN, the metal salt) in a round bottom flask. The mixture was stirred mechanically for 3 hour at room temperature, after which optionally varying amounts of N,N'-diethylethylenediamine (DEEDA, a bifunctional ligand) were added. The composition of the metal complexes is shown in table 1. The resulting mixture was stirred for 45 hours at room temperature.

TABLE 1

Metal complexes comprising functional ligands and the resulting viscosity

| sample | SN (g) | DiPA (g) | DEEDA (g) | Viscosity (Pa · s)* |
|--------|--------|----------|-----------|---------------------|
| 1.1    | 10.1   | 4.58     | 0         | 0.7                 |
| 1.2    | 10.0   | 4.31     | 0.12      | 1.1                 |
| 1.3    | 9.9    | 4.06     | 0.25      | 1.7                 |
| 1.4    | 11.1   | 4.37     | 0.38      | 3.1                 |
| 1.5    | 10.2   | 3.93     | 0.40      | 4.1                 |
| 1.6    | 9.9    | 3.73     | 0.43      | 4.6                 |
| 1.7    | 10.0   | 3.50     | 0.59      | 7.8                 |
| 1.8    | 10.1   | 3.41     | 0.66      | 9.9                 |

*viscosity at shear rate of 1e-5 per second

Of each sample the viscosity was determined by using a TA Instruments AR-G2 rheometer using a plate-plate geometry. The width of the plate was 25 mm. For viscosity measurements in this range the gap was set at 300 micrometers. For compositions having a lower viscosity like inkjet inks the gap would be set at 100 micrometers. Using a water cooled Peltier element the temperature of the samples was kept at 25.0 C during the measurement. FIG. 1 shows the results of the measurement using sample 1.7.

Figure 2:
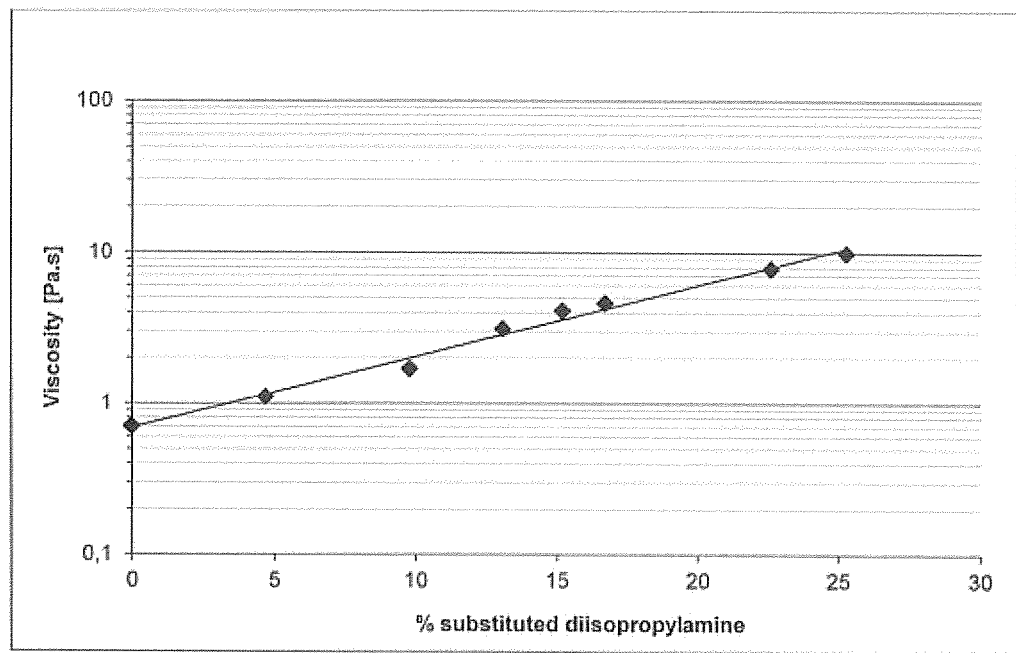
FIG. 2 shows the viscosity of each sample of Example 1 at a shear rate of $1 \cdot 10^3$ l/s as plotted against the percentage of diisopropylamine (DiPA, a monofunctional ligand).

In FIG. 2 the viscosity of each sample at a shear rate of $1 \cdot 10^3$ l/s is plotted against the percentage of DiPA, that has been replaced by DEEDA (functional groups derived from the multifunctional ligand). When plotting the viscosity on a logarithmic scale (y-axis) a linear dependency on the percentage of substituted DiPA can be clearly seen. Therefore, the viscosity of the metal complex can be adjusted as desired.

2. Absorption Patterns of Metal Complexes Comprising Functional Ligand

Films of samples 1.1 and 1.8 on quartz slides were prepared by spincoating. For reference purposes a film of silver neodecanoate not comprising any functional ligand was prepared in a similar fashion from a 20 wt % solution in toluene. The absorbance of each film was determined using a Shimadzu UV-3102 PC UV-VIS NIR spectrophotometer.

Figure 3:
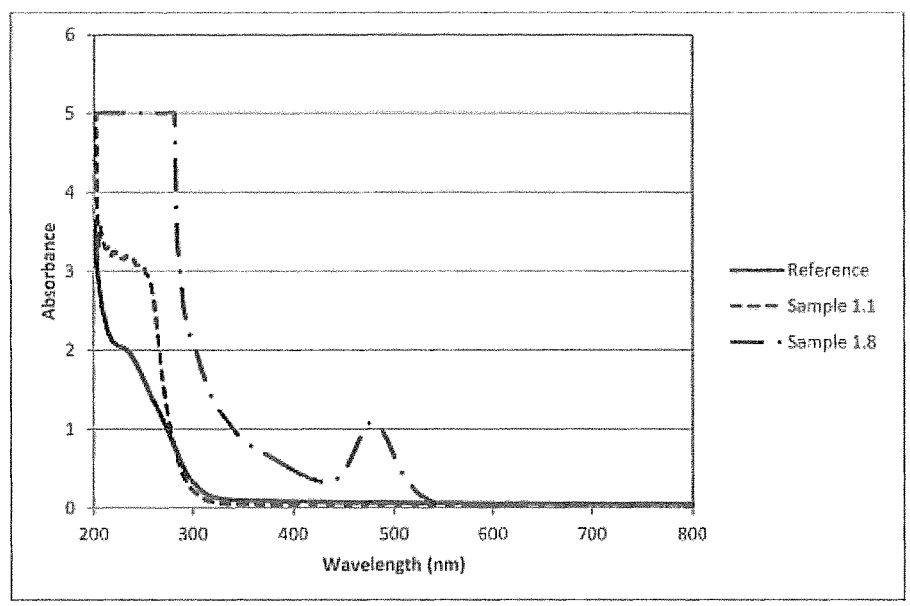
FIG. 3 shows the absorption spectra of a metal salt alone (silver neodecanoate), of a metal salt complex with a monofunctional ligand (ink A, corresponding to sample 1.1) and of a metal salt complex which includes silver neodecanoate, a monofuntional and a multifunctional ligand (ink B, corresponding to sample 1.8).

FIG. 3 shows the absorption spectra of a metal salt alone (silver neodecanoate), of a metal salt complex with a monofunctional ligand (ink A, corresponding to sample 1.1) and of a metal salt complex which includes silver neodecanoate, a monofuntional and a multifunctional ligand (ink B, corresponding to sample 1.8). As can be seen the absorption spectrum of the ink comprising a mono- and multifunctional ligand is widened and shows another peak around 500 nm.

The invention claimed is:

1. A method comprising:
providing a printing ink composition comprising a metal salt of a metal ion and a counter ion, and a viscosity adjusting agent, wherein the metal ion is present as a metal complex of the metal ion and the viscosity adjusting agent, wherein the metal of the metal ion is selected from the group consisting of Ag, Cu, Pd, Au, Pt, Ni, In, Sn, Al and Zn, wherein the viscosity adjusting agent comprises a combination of at least one monofunctional ligand and at least one multifunctional ligand, wherein a monofunctional ligand is a ligand having one functional group, and a multifunctional ligand is a ligand having more than one functional group, wherein the metal ion and the viscosity adjusting agent are present in a molar ratio 1:y, where y represents the molar amount of functional groups present in the viscosity adjusting agent, wherein y is in the range of 1-4, and wherein the functional group of the monofunctional ligand or a functional group of the multifunctional ligand is selected from the group consisting of a carbonyl, amino, aromatic, ether, ester or thioester group, an unsaturated carbon bond or a functional radical;
utilizing the printing ink composition for printing conductive tracks and patterns, semiconductive tracks and patterns, emitting tracks and patterns and absorbing tracks and patterns; and
converting the metal complex in the printing ink into a metal film by curing or reducing step it after it has been deposited on a substrate.

2. A method of obtaining a conductive track or pattern, which method comprises the following steps:
i) depositing an ink composition on a substrate, wherein the metal ion is present as a metal complex of the metal ion and the viscosity adjusting agent, wherein the metal of the metal ion is selected from the group consisting of from Ag, Cu, Pd, Au, Pt, Ni, In, Sn, Al and Zn, wherein the viscosity adjusting agent comprises a combination of at least one monofunctional ligand, a monofunctional ligand being a ligand having one functional group, and at least one multifunctional ligand, and a multifunctional ligand being a ligand having more than one functional groups,
wherein the metal ion and the viscosity adjusting agent are present in a molar ratio 1:y, where y represents the molar amount of functional groups present in the viscosity adjusting agent, wherein y is in the range of 1-4, and wherein the functional group of the monofunctional ligand or a functional group of the multifunctional ligand is selected from the group consisting of a carbonyl, amino, aromatic, ether, ester or thioester group, an unsaturated carbon bond or a functional radical, and
ii) after the ink composition has been deposited in the form of complexed metal ions on the substrate converting the metal ions that are present as metal complex in the printing ink into a metal film by curing or reducing said metal ions.

3. The method of claim 2, wherein the first step is carried out by printing, solution casting, spin coating, doctor blading, dip coating, capillary filling or spray coating, preferably by non-contact printing, more preferably by ink-jet printing, screen printing, off-set printing and flexo printing.

4. The method of claim 2, wherein the second method step is caused by electromagnetic radiation, heat convection, plasma treatment, or chemical reduction, or any combination of these, preferably by electromagnetic radiation or heat convection, or a combination of these two.

5. The method of claim 2, wherein the metal ion and the viscosity adjusting agent are present in a molar ratio 1:y, where y represents the molar amount of functional groups present in viscosity adjusting agent, and wherein y is in the range of 1-4.

6. The method of claim 2, wherein the viscosity adjusting agent comprises a combination of at least one monofunctional ligand and at least one multifunctional ligand.

7. The method of claim 2, wherein the functional group of the monofunctional ligand or a functional group of the multifunctional ligand comprises a hydroxyl, carbonyl, amino, aromatic, ether, ester or thioester group, an unsaturated carbon bond or a functional radical, preferably the functional group comprises an amine moiety, pyridine moiety, carboxyl moiety, sulphide, phosphine, (cyclo)(octa)diene or phenanthroline moiety.

8. The method of claim 2, wherein the functional ligand is selected from the group consisting of alkynes, (di)amines, amides, alcohols, aminoalcohols, aldehydes, carboxylic acids, carbamic acids, dienes, phosphines, phosphites, thioamides.

9. The method of claim 2, wherein the metal of the metal ion is chosen from Ag, Cu, Pd, Au, Pt, Ni, In, Sn, Al and Zn, preferably the metal is Ag or Cu.

10. The method of claim 2, wherein the metal salt is an organic metal salt selected from a metal carboxylate, metal carbamate, metal (3-diketonate, metal p-ketoiminate, metal thioamide or metal thioacid, preferably selected from a metal carboxylate, a metal carbamate and a metal carbonate, preferably a metal carboxylate, more preferably a metal pivalate, most preferably a silver pivalate.

11. The method of claim 2, wherein the ink composition has a viscosity of 3-2 5 mPa·s, for use in inkjet printing.

12. The method of claim 2, wherein the ink composition has a viscosity of 0.05-0.5 Pa·s, for use in flexo printing.

13. The method of claim 2, wherein the ink composition has a viscosity of 1-10 Pa·s, for use in screen printing.

14. The method of claim 2, wherein the ink composition is free from solvent.

* * * * *